(12) United States Patent
Onodera et al.

(10) Patent No.: US 7,489,029 B2
(45) Date of Patent: Feb. 10, 2009

(54) CARRIER STRUCTURE FOR STACKED-TYPE SEMICONDUCTOR DEVICE, METHOD OF PRODUCING THE SAME, AND METHOD OF FABRICATING STACKED-TYPE SEMICONDUCTOR DEVICE

(75) Inventors: Masanori Onodera, Tokyo (JP); Kouichi Meguro, Tokyo (JP); Junichi Kasai, Kanagawa (JP); Yasuhiro Shinma, Kanagawa (JP); Koji Taya, Kanagawa (JP); Junji Tanaka, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 302 days.

(21) Appl. No.: 11/214,630

(22) Filed: Aug. 30, 2005

(65) Prior Publication Data

US 2006/0043600 A1 Mar. 2, 2006

Related U.S. Application Data

(63) Continuation of application No. PCT/JP2004/012476, filed on Aug. 30, 2004.

(51) Int. Cl.
 *H01L 23/02* (2006.01)
 *H01L 23/34* (2006.01)
 *H01L 21/00* (2006.01)
(52) U.S. Cl. .................. 257/686; 257/723; 438/106
(58) Field of Classification Search ......... 361/729–730; 257/685
See application file for complete search history.

(56) References Cited

U.S. PATENT DOCUMENTS

| 6,060,778 | A | 5/2000 | Jeong et al. ............. 257/710 |
| 6,495,895 | B1 * | 12/2002 | Peterson et al. ........ 257/434 |
| 6,674,159 | B1 * | 1/2004 | Peterson et al. ........ 257/680 |
| 2003/0137057 | A1 | 7/2003 | Honda ................. 257/778 |

FOREIGN PATENT DOCUMENTS

| JP | 3-280496 | | 12/1991 |
| JP | 3280496 | * | 12/1991 |
| JP | 5-74978 | | 3/1993 |
| JP | 5074978 | * | 3/1993 |
| JP | 11-45956 | | 2/1999 |
| JP | 11-251483 | | 9/1999 |
| JP | 2003-289120 | | 10/2003 |

* cited by examiner

*Primary Examiner*—Andy Huynh
*Assistant Examiner*—Hoang-Quan Ho

(57) ABSTRACT

A carrier structure for fabricating a stacked-type semiconductor device includes: a lower carrier that has laminated thin plates and has first openings for mounting first semiconductor packages thereon; and an upper carrier having second openings for mounting second semiconductor packages on the first semiconductor packages. The lower carrier composed of the laminated thin plates realizes an even plate thickness and reduces warps because stress is distributed to the thin plates. This results in an improved production yield. A pattern of the openings in the thin plates of the lower carrier may be formed by etching or electric discharging. The openings thus formed have reduced warps and burrs.

8 Claims, 6 Drawing Sheets

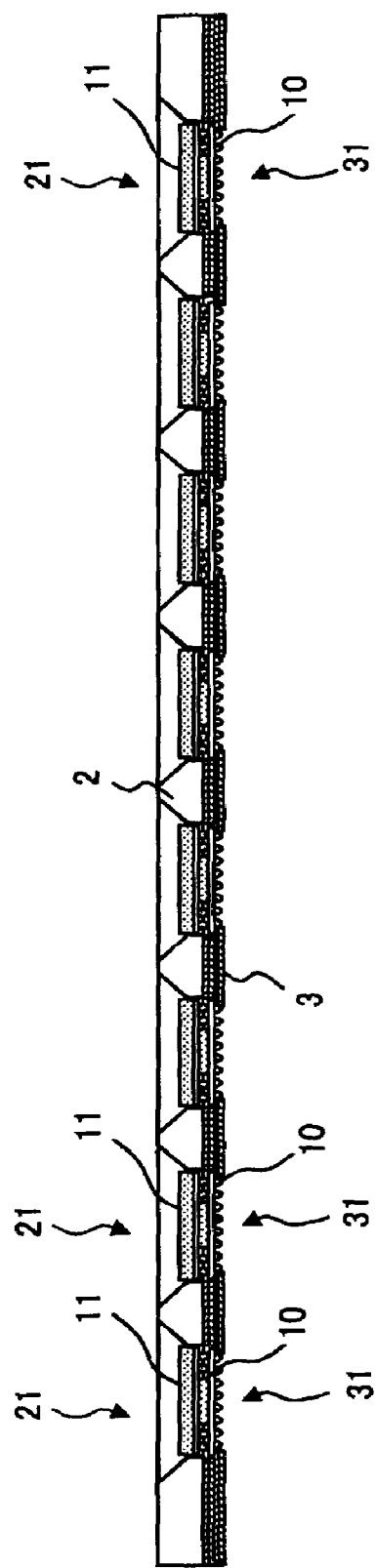

Fig. 3A
Fig. 3B
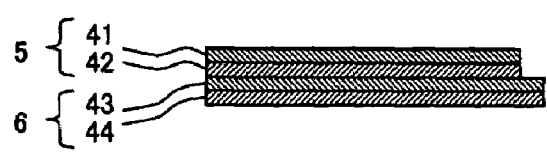

US 7,489,029 B2

CARRIER STRUCTURE FOR STACKED-TYPE SEMICONDUCTOR DEVICE, METHOD OF PRODUCING THE SAME, AND METHOD OF FABRICATING STACKED-TYPE SEMICONDUCTOR DEVICE

CROSS REFERENCE TO RELATED APPLICATIONS

This is a continuation of International Application No. PCT/JP2004/012476, filed Aug. 30, 2004.

BACKGROUND OF THE INVENTION

1. Field of the Invention

The present invention relates to a carrier structure for stacked-type semiconductor devices, a method of producing the carrier structure, and a method of fabricating a stacked-type semiconductor device, and more particularly, to a carrier structure for a stacked-type semiconductor device having semiconductor packages stacked and packaged into a single semiconductor package, a method of producing this type of carrier structure, and a method of fabricating the stacked-type semiconductor device.

2. Description of the Related Art

Recently, portable electronic equipment such as a movable phone, and non-volatile recording media such as IC memory cards have been downsized, and it has been required to reduce the number of components used in the apparatuses and recording media and achieve further downsizing of the components.

It is thus desired to develop the technique of effectively packaging semiconductor chips, which are essential components among the structural components. Examples of semiconductor packages that meet the requirements are a chip scale package (CSP) having a size as large as the semiconductor chips, a multi-chip package (MCP) having multiple semiconductor chips accommodated into a single package, and a package-on-package (PoP) having multiple semiconductor packages stacked and packaged into a single piece.

However, the carriers used for fabricating the stacked-type packages are required to stack the upper and lower semiconductor packages with high precision and have a certain production precision for maintaining a satisfactory production yield of the semiconductor packages.

More specifically, the carriers should be designed taking the following into consideration:

(1) the difference in dimensions between the upper and lower semiconductor packages;

(2) the difference in dimensions between the openings of the upper and lower carriers for accommodating the semiconductor packages; and (3) the degree of self-alignment of solder balls by reflow heating after the upper and lower packages are mounted. Recent stacked-type packages have a thin total thickness, and there is an increased difficulty in producing the carriers.

SUMMARY OF THE INVENTION

The present invention has been made taking the above into consideration, and has an object of providing a carrier structure for stacked-type semiconductor devices, a method of producing the carrier structure, and a method of fabricating the stacked-type semiconductor devices capable of improving the production yield.

The above object of the present invention is achieved by a carrier structure for fabricating a stacked-type semiconductor device including: a lower carrier that has laminated thin plates and has first openings for mounting first semiconductor packages thereon; and an upper carrier having second openings for mounting second semiconductor packages on the first semiconductor packages. In case where the lower carrier is formed by scraping of metal, there is a difficulty in obtaining the even plate thickness and the carrier is likely to be warped. If this lower carrier is used for the fabrication of the stacked-type semiconductor devices, the lower carrier may cause a mismatch of the outer dimensions and a joining failure between the upper and lower semiconductor packages, so that the production yield is degraded. In contrast, the thin plates may be formed by the metal rolling process, and may be produced with extremely high precision. The lower carrier formed by the laminated thin plates has an even thickness and a reduced warp in which stress is distributed to the thin plates. This increases the production yield.

The lower carrier may include a thin film having an opening area smaller than an outer size of the first semiconductor packages, and another thin film that is laminated on the thin film and has an opening area larger than the outer size of the first semiconductor packages. The smaller opening area of the thin film that is smaller than the outer size of the first semiconductor packages makes it possible to mount an interposer of the first semiconductor packages on the thin film and to prevent the interposer from falling off the opening. Another thin film that is mounted on the thin film and has the large opening area larger than the outer size of the semiconductor packages functions as a guide. With this structure, it is possible to prevent the semiconductor packages accommodated in the lower carrier from falling off and detaching and suppress positional errors in mounting as much as possible. The opening area of another thin film may be selected taking into account the accuracy of the outer sizes of the semiconductor devices and the accuracy of the processed dimensions.

A magnet may be buried in the lower carrier. The lower carrier and the upper carrier should be contacted as close as possible. The use of only positioning pins may cause a gap between the lower and upper carriers and may affect the positioning accuracy at the time of mounting. The use of the magnet makes it possible to bring the upper and lower carriers into contact with each other and improve the production yield.

Multiple magnets may be buried in the lower carrier. The magnets may be uniformly arranged in the entire surface of the lower magnet, so that the lower and upper semiconductor packages may be brought into a close contact and the production yield can be improved.

The lower carrier may have multiple openings and accommodate a plurality of semiconductor devices. The multiple semiconductor devices can be produced at a time with the single carrier, and the productivity can be improved. Particularly, the productivity can be much improved with the automatic mounter.

The lower carrier may have clearance structures for corners of the first semiconductor packages, and the clearance structures are arranged at corners of the first openings. The outer sizes and mounting positions of the semiconductor packages may slightly differ from one another. Thus, there is a possibility that the corners of the lower semiconductor packages may be brought into contact with the lower carrier when the upper packages are mounted or the carrier is transported. The clearance structures provided in the corners of the opening of the lower carrier prevent the corners of the semiconductor packages from being brought into contact with the lower carrier. It is thus possible to prevent the corners of the semiconductor devices from being deformed or damaged.

The clearance structures may be defined by some of the laminated thin plates.

The first openings may be formed by etching or electric discharge machining. Alternatively, the thin plates may be processed by scraping or press punching. However, these processes are apt to cause warps. Particularly, the press punching process makes it easy to cause burrs on the cutting planes. The presence of warps or burrs may cause an insertion failure and a mounting position error of the lower semiconductor packages in the stacking process of the semiconductor packages. This reduces the production yield. In contrast, the use of etching or wire electric discharging solves the above-mentioned problems.

The laminated thin plates may be joined by spot welding. An alternative method may use an adhesive to join the upper surfaces of the molded resins of the lower semiconductor packages to those of the upper semiconductor packages. However, this method makes it easy to cause a warp due to stress developed at the interfaces between the different materials (due to the difference in the thermal expansion coefficient). In contrast, the present invention does not use the different materials but employs spot welding for local joining, but enables to greatly suppress warps. This joining method brings the great advantages of warp reduction, particularly in the reflow process.

The present invention includes a method of producing a carrier structure for fabricating a stacked-type semiconductor device comprising the steps of: laminating thin plates for a lower carrier associated with an upper carrier; and forming openings in the thin plates by etching or electric discharge machining. Alternatively, the thin plates may be processed by scraping or press punching. However, these processes are apt to cause warps. Particularly, the press punching process makes it easy to cause burrs on the cutting planes. The presence of warps or burrs may cause an insertion failure and a mounting position error of the lower semiconductor packages in the stacking process of the semiconductor packages. This reduces the production yield. In contrast, the use of etching or wire electric discharging solves the above-mentioned problems.

The present invention includes a method of producing a carrier structure for fabricating a stacked-type semiconductor device comprising the steps of: laminating thin plates for a lower carrier associated with an upper carrier; and joining the thin plates by spot welding. An alternative method may use an adhesive to join the upper surfaces of the molded resins of the lower semiconductor packages to those of the upper semiconductor packages. However, this method makes it easy to cause a warp due to stress developed at the interfaces between the different materials (due to the difference in the thermal expansion coefficient). In contrast, the present invention does not use the different materials but employs spot welding for local joining, but enables to greatly suppress warps. This joining method brings the great advantages of warp reduction, particularly in the reflow process.

The present invention provides a method of fabricating a stacked-type semiconductor device comprising the steps of: mounting first semiconductor packages on a lower carrier that has laminated thin plates and has first openings for mounting the first semiconductor packages; mounting second semiconductor packages on an upper carrier that has second openings for mounting the second semiconductor packages on the first semiconductor packages; and joining the first and second semiconductor packages by reflow. This method improves the production yield.

The present invention provides a carrier structure comprising a carrier that has laminated thin plates and has first openings for mounting semiconductor packages thereon. The carrier may include a thin film having an opening area smaller than an outer size of the semiconductor packages, and another thin film that is laminated on the thin film and has an opening area larger than the outer size of the semiconductor packages. The carrier has a magnet that may be buried therein. The carrier may have clearance structures for corners of the semiconductor packages, and the clearance structures are arranged at corners of the first openings. The clearance structures may be defined by some of the laminated thin plates.

BRIEF DESCRIPTION OF THE DRAWINGS

FIG. 1 is a cross-sectional view of a carrier structure for fabricating a stacked-type semiconductor device according to an embodiment of the present invention;

FIG. 3 is an enlarged view of a part S1 shown in FIG. 2B;

DESCRIPTION OF THE PREFERRED EMBODIMENTS

Figures 2A, 2B:
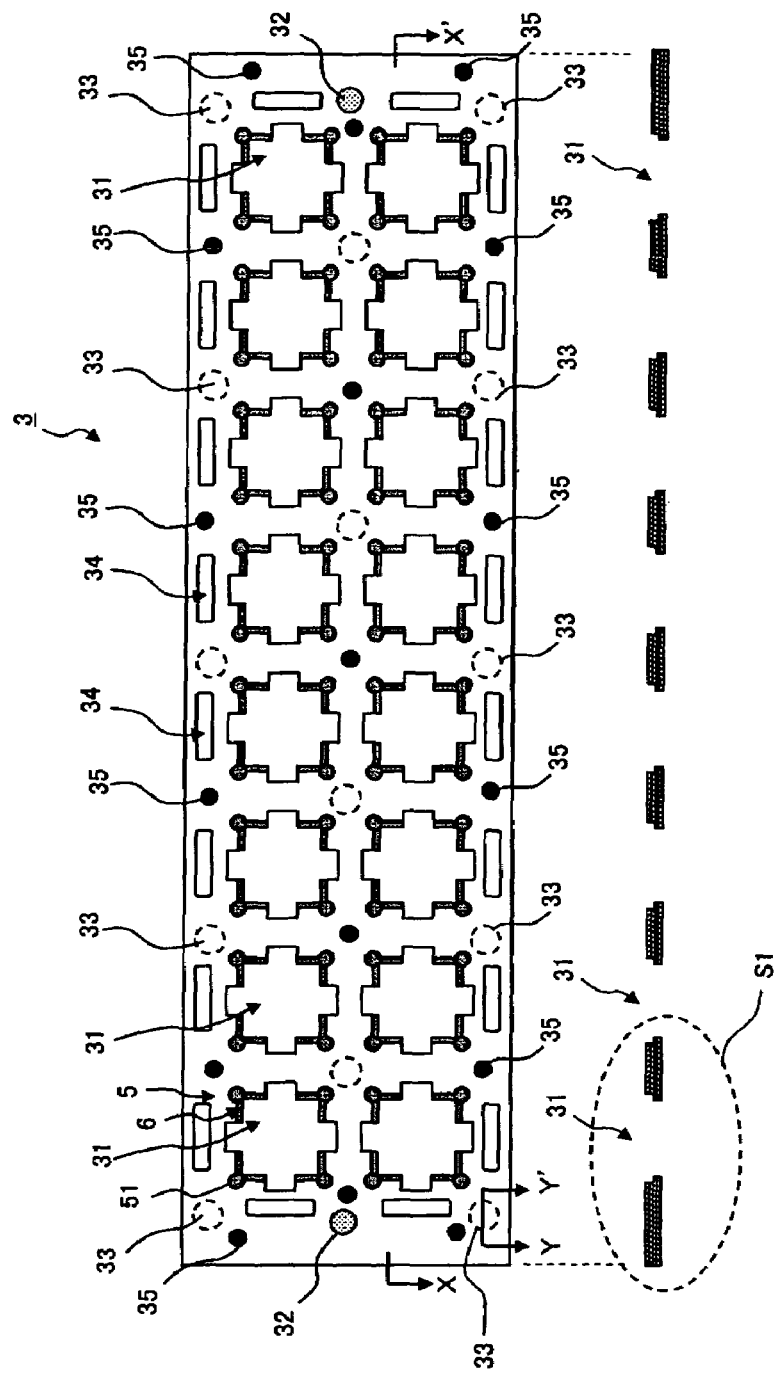
FIG. 2A is a plan view of a lower carrier.
FIG. 2B is a cross-sectional view taken along a line X-X' shown in FIG. 2A.

A description will now be given of preferred embodiments of the present invention with reference to the accompanying drawings. FIG. 1 is a cross-sectional view of a carrier structure for fabricating a stacked-type semiconductor device according to an embodiment of the present invention (hereinafter, the carrier structure may be simply referred to as carrier). Referring to FIG. 1, a carrier 1 is composed of an upper carrier 2 and a lower carrier 3. The lower carrier 3 has a plurality of openings 31 for mounting first semiconductor packages 10, and is composed of multiple thin plates stacked. Each thin plate may be stainless. The upper carrier 2 has a plurality of openings 21 for mounting semiconductor packages 11 on the first semiconductor packages 10. The upper carrier 2 may be made of aluminum. The upper carrier 2 is stacked on the lower carrier 3, and the first semiconductor packages 10 are mounted so as to cover the openings 31. Then, the second semiconductor packages 11 are stacked on the first semiconductor packages 10. Solder balls of the semiconductor packages 10 and 11 are melted by reflow heating, and the stacked-type semiconductor devices are thus produced.

Next, the lower carrier 3 will be described. FIG. 2A is a plan view of the lower carrier, and FIG. 2B is a cross-sectional view taken along a line X-X' shown in FIG. 2B, in which slits are omitted. FIG. 3 is an enlarged view of a part S1 shown in FIG. 2B. In FIGS. 2A and 2B, reference numerals 31 indicate openings, 32 are positioning pins, 33 are magnets, 34 are slits, 35 are welding positions. The lower carrier 3 has 16 openings 31, and accommodates 16 semiconductor packages 10.

The lower carrier 3 includes an upper portion 5 and a lower portion 6. The upper portion 5 of the lower carrier 3 is composed of thin plates 41 and 42 that are stacked. The lower portion 6 of the lower carrier 3 is composed of thin plates 43 and 44 that are stacked. The lower carrier 3 formed by the multiple thin plates 41 through 44 has an even plate thickness and a reduced warp in which stress is distributed to the multiple thin plates. Thus, the production yield of the stacked-type semiconductor devices can be improved.

The lower carrier 3 is formed so that the thin plates 41 and 42 having the larger opening areas than the outer size of the first semiconductor packages 10 are stacked on the thing plates 43 and 44 having the smaller opening areas than the outer size of the first semiconductor packages 10. By making the opening areas of the thin plates 43 and 44 smaller than the outer size of the semiconductor packages 10, the substrate (interposer) portions of the semiconductor packages 10 can be mounted on the thin plate 43 and the semiconductor packages 10 can be prevented from falling off the openings 31. The thin plates 41 and 42 having the larger opening areas larger than the outer size of the semiconductor packages 10 function as a guide.

As shown in FIGS. 2A and 2B, the multiple thin plates 41 through 44 are joined by spot welding at welding positions indicated by a reference numeral 35. This structure enables local joining without the use of another substance such as an adhesive and restrains the occurrence of warp.

The openings 31 of the thin plates may be formed by etching with a chemical or wire electric discharging. This process reduces warps and burrs on the cutting planes.

The positioning pins 32 are provided at two positions on the lower carrier 3. The upper carrier 2 is mounted from the upper side of the lower carrier 3 with the positioning pins 32 and is engaged with the lower carrier 3.

The multiple magnets 33 are buried in the lower carrier 3. It is necessary to make a contact with the lower carrier 3 and the upper carrier 2 as close as possible. The use of only the positioning pins 32 may result in a gap between the carriers and may affect the alignment accuracy. The magnets 33 buried in the lower carrier 3 makes a close contact and contributes to improving the production yield.

Figure 4B:
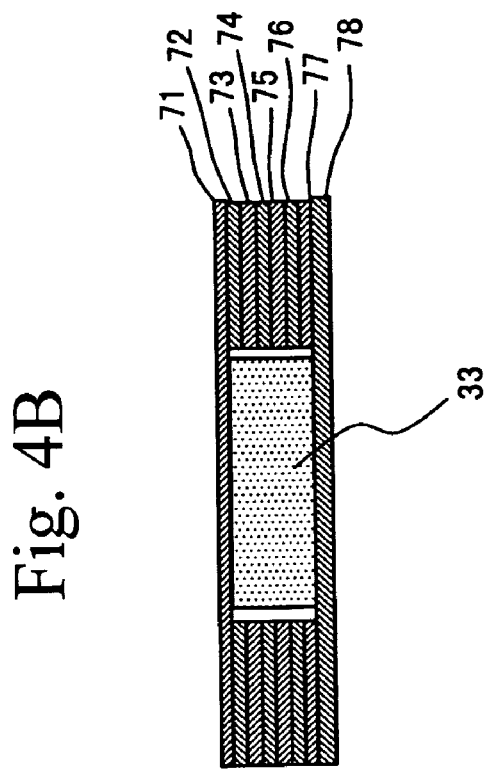
FIG. 4B shows an example in which the lower carrier is composed of eight thin plates.
Figure 4A:
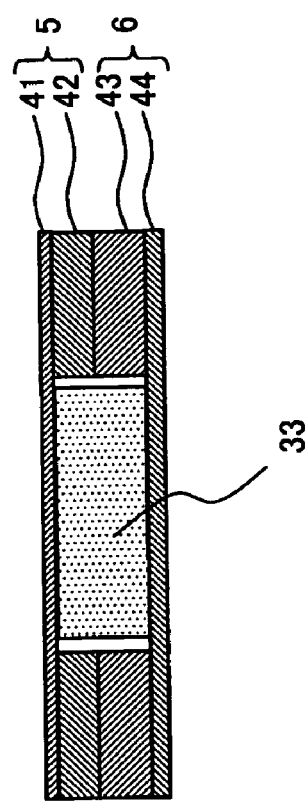
FIG. 4A is a cross-sectional view taken along a line Y-Y' shown in FIG. 2A.

FIG. 4A is a cross-sectional view taken along a line Y-Y' shown in FIG. 2A, and FIG. 4B shows an exemplary structure in which the lower carrier 3 is formed by eight thin films. In FIGS. 4A and 4B, thin plates are provided on opposing surfaces of the magnets 33. As shown in FIG. 4A, the lower carrier 3 has the upper portion 5 and the lower portion 6. The upper portion 5 of the lower carrier has the thin plates 41 and 42 that are stacked, and the lower portion 6 thereof has the thin plates 43 and 44 that are stacked. As shown in FIG. 4B, the lower carrier 3 has thin plates 71 through 74 that form an upper portion, and thin plates 75 through 78 that form a lower portion. Preferably, the magnets 33 are made of a substance that retains a certain magnetic force in the buried state, and may be samarium-cobalt magnet.

Turning to FIG. 2 again, the slits 34 are formed along the outer edges of the lower carrier 3. The slits 34 function to absorb warps that may be caused with the lower carrier 3 being heated.

Figure 5:
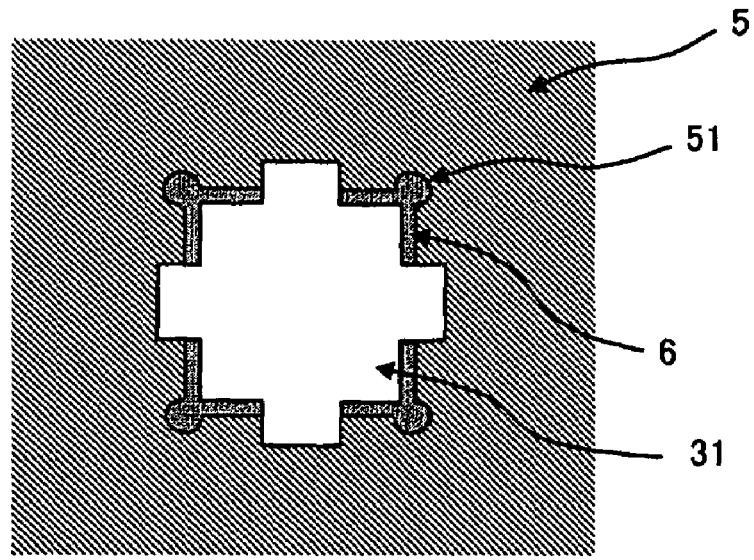
FIG. 5 is an enlarged view of an opening of the lower carrier and its vicinity.

FIG. 5 is an enlarged view of an opening of the lower carrier 3 and its vicinity. In FIG. 5, a reference numeral 31 indicates one of the openings formed in the lower carrier, 5 is the upper portion of the lower carrier formed by the thin plates 41 and 42, 51 indicates circular clearance structures formed on the upper portion of the lower carrier, and 6 is the lower portion of the lower carrier. The clearance structures 51 are formed on the thin films 41 and 42, which are parts of the thin plates of the lower carrier 3. The outer sizes and mounting positions of the semiconductor packages may slightly differ from one another. Thus, there is a possibility that the corners of the lower semiconductor packages may be brought into contact with the lower carrier 3 when the upper packages are mounted or the carrier is transported. The clearance structures 51 provided in the corners of the opening 31 of the lower carrier prevent the corners of the semiconductor packages from being brought into contact with the lower carrier 3. It is thus possible to prevent the corners of the semiconductor devices from being deformed or damaged.

Figure 6:
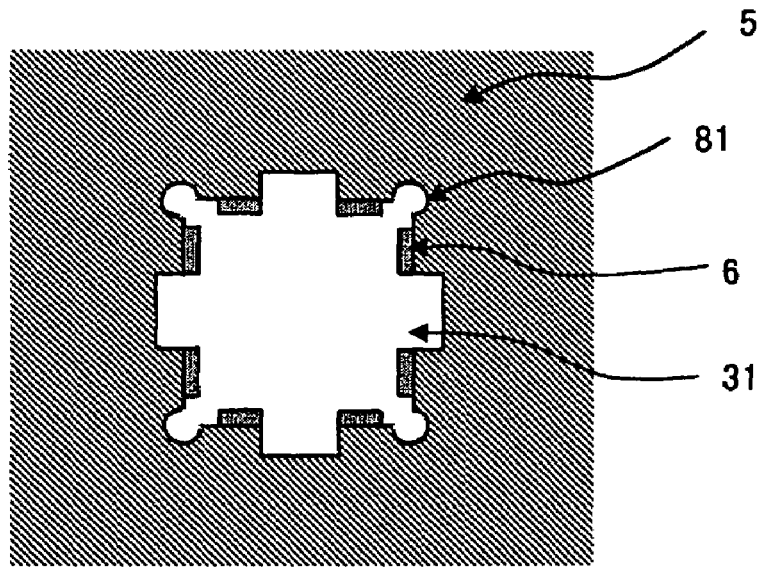
FIG. 6 shows another example having a clearance structure formed at a corner of the opening of the lower carrier.

FIG. 6 shows another structure of the clearance structures formed at the corners of the opening formed in the lower carrier 3. In this figure, reference numeral 31 indicates one of the openings formed in the lower carrier, 5 is the upper portion, 6 is the lower portion and 81 indicates clearance structures. In the structure shown in FIG. 6, the clearance structures 81 are formed on all the thin films 41 through 44 that form the lower carrier 3. With this structure, it is possible to prevent the corners of the semiconductor device from being deformed and damaged and to raise the temperature of the entire semiconductor package because heated wind directly hits the corners of the semiconductor packages at the time of reflow.

Figure 7A:
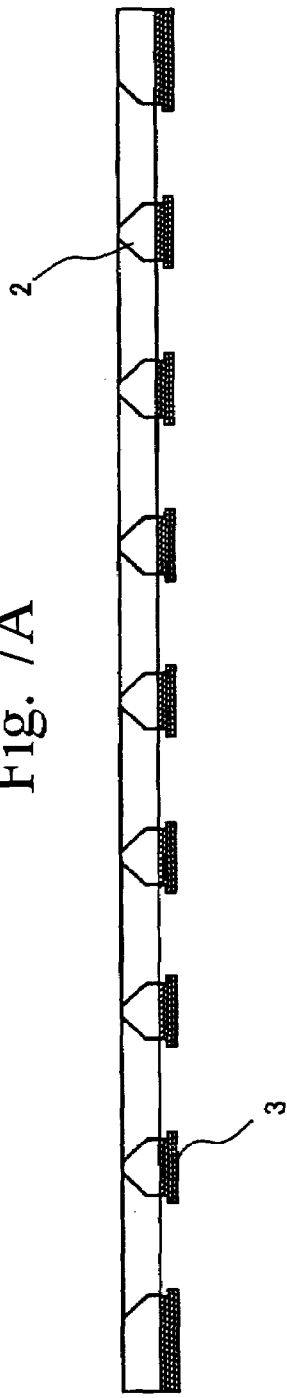
FIGS. 7A, 7B and 7C are views of a process of fabricating a stacked-type semiconductor device with the carriers according to the embodiment.
Figure 7B:
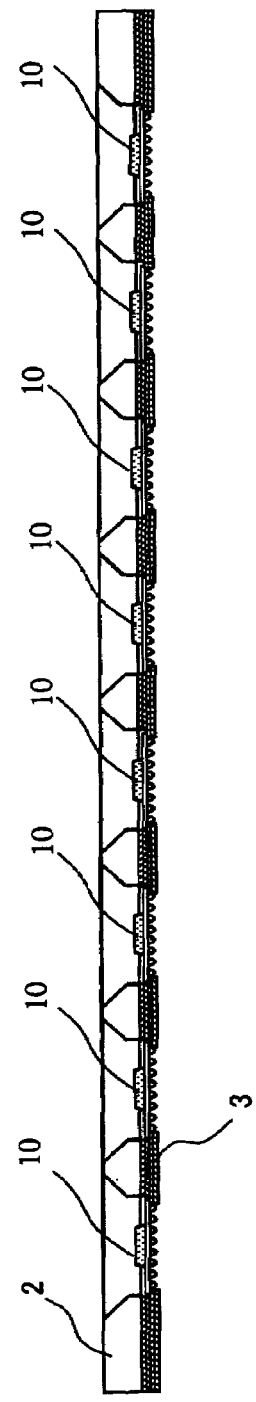
Figure 7C:
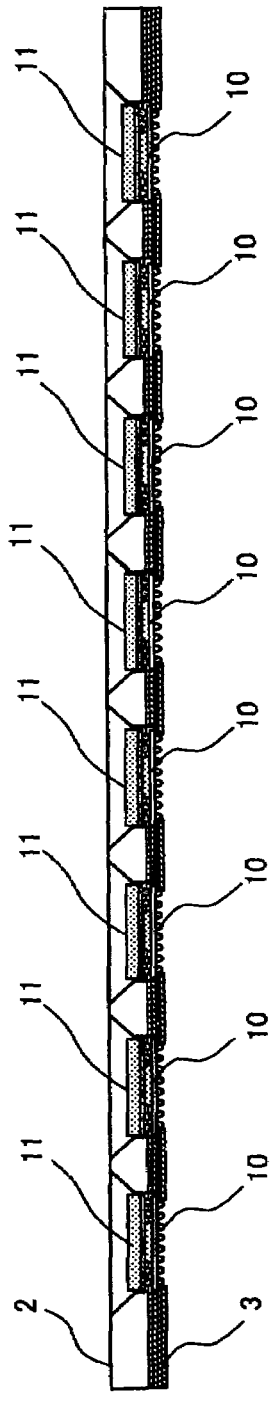

FIGS. 7A, 7B and 7C show a process of fabricating the stacked-type semiconductor device with the carrier of the present invention. More particularly, FIG. 7A is a cross-sectional view of the upper carrier mounted on the lower carrier, FIG. 7B is a cross-sectional view of the stacked upper and lower carriers in which lower semiconductor packages are placed, and FIG. 7C is a cross-sectional view of the stacked upper and lower carriers in which upper semiconductor packages are mounted on the lower semiconductor packages. As shown in FIG. 7A, the upper carrier 2 is mounted on the lower carrier 3. Next, as shown in FIG. 7B, the lower semiconductor packages 10 are set in the openings 31 of the lower carrier 3. Then, as shown in FIG. 7C, the upper semiconductor packages 11 are mounted on the lower semiconductor packages 10, and the solder balls of the semiconductor packages are melted by reflow. In this manner, the stacked-type semiconductor devices are fabricated.

According to the present embodiment, it is possible to provide the lower carrier taking the following into consideration: (1) the difference in dimensions between the upper and lower semiconductor packages; (2) the difference in dimensions between the openings of the upper and lower carriers for accommodating the semiconductor packages; and (3) the degree of self-alignment of solder balls by reflow heating after the upper and lower packages are mounted. Recent stacked-type packages have a thin total thickness, and there is an increased difficulty in producing the carriers. With the use of the carrier for fabricating the stacked-type semiconductor devices including the unique lower carrier, it is possible to improve the production yield. The carrier for fabricating the stacked-type semiconductor devices including the unique lower carrier may be produced by the process including the steps of forming a pattern of openings in thin films included in the lower carrier by means of etching or electric discharge machining, and laminating the thin films of the lower carrier and joining them by spot welding.

The stacked-type semiconductor device may be fabricated by the process including the steps of: mounting first semiconductor packages on a lower carrier that has laminated thin plates and has first openings for mounting the first semiconductor packages; mounting second semiconductor packages on an upper carrier that has second openings for mounting the second semiconductor packages on the first semiconductor packages; and joining the first and second semiconductor packages by reflow. The production yield can be improved.

In the foregoing, the preferred embodiments of the present invention were described in detail. The present invention is not limited to the specifically described embodiments, and various variations and modifications may be made with the scope of the claims.

What is claimed is:

1. A carrier structure for fabricating a stacked-type semiconductor device comprising:

a lower carrier having laminated thin plates and having first openings for mounting first semiconductor packages thereon; and an upper carrier having second openings for mounting second semiconductor packages on the first semiconductor packages, the lower carrier having at least a magnet that is buried therein.

2. The carrier structure as claimed in claim 1, wherein the lower carrier comprises a thin film having an opening area smaller than an outer size of the first semiconductor packages, and another thin film that is laminated on the thin film and has an opening area larger than the outer size of the first semiconductor packages.

3. The carrier structure as claimed in claim 1, the lower carrier having a plurality of magnets that are buried therein.

4. The carrier structure as claimed in claim 1, wherein the first openings of the lower carrier are arranged in rows and columns.

5. The carrier structure as claimed in claim 1, the lower carrier having clearance structures for corners of the first semiconductor packages, and the clearance structures are arranged at corners of the first openings.

6. The carrier structure as claimed in claim 5, wherein the clearance structures are defined by some of the laminated thin plates.

7. The carrier structure as claimed in claim 1, wherein the first openings are formed by etching or electric discharge machining.

8. The carrier structure as claimed in claim 7, wherein the laminated thin plates are joined by spot welding.

* * * * *